United States Patent [19]

Ketelhohn

[11] Patent Number: 4,985,111

[45] Date of Patent: Jan. 15, 1991

[54] PROCESS AND APPARATUS FOR INTERMITTENT FLUID APPLICATION

[75] Inventor: Karl F. G. Ketelhohn, State College, Pa.

[73] Assignee: Chemcut Corporation, State College, Pa.

[21] Appl. No.: 487,593

[22] Filed: Mar. 2, 1990

[51] Int. Cl.⁵ .................. B44C 1/22; C03C 15/00; C03C 25/06

[52] U.S. Cl. ............................. 156/640; 156/642; 156/345

[58] Field of Search ............... 156/640, 641, 642, 345; 134/34, 198, 199

[56] References Cited

U.S. PATENT DOCUMENTS

| | | | |
|---|---|---|---|
| 2,822,635 | 2/1958 | Mears | 156/640 |
| 4,233,106 | 11/1980 | Goffredo | 156/640 X |
| 4,397,708 | 8/1983 | Frantzen | 156/640 X |
| 4,650,542 | 3/1987 | Ash | 156/640 |

Primary Examiner—William A. Powell
Attorney, Agent, or Firm—Paul & Paul

[57] ABSTRACT

A process and apparatus for fluid treating articles delivered along a predetermined path through a zone where the angle of application of such fluid is varied. A plurality of discharge orifices at different pre-set angular orientations are provided at such zone to sequentially discharge and interrupt treating fluid in a controlled manner to impinge upon the articles at different angles of impingement. The orifices are provided in sets at said orientations and are alternatively open and closed to delivery the fluid sequentially by means of appropriate valving with sufficient force to prevent puddling as the articles are conveyed along a generally horizontal path.

20 Claims, 2 Drawing Sheets

PROCESS AND APPARATUS FOR INTERMITTENT FLUID APPLICATION

BACKGROUND OF THE INVENTION

In the manufacture of printed circuit boards, printed circuit elements and like goods, and in processes connected with the same, it has become commonplace to deliver the articles, such as printed circuit boards, printed circuit film or the like, through a chamber in a continuous manner, while the articles are being treated by the spray of a suitable treatment fluid, such as an etchant, onto them. Often the etchant is of a corrosive nature, but on other occasions it can be various chemical solutions or even ordinary rinsing liquid, such as water. See, for example, U.S. Pat. No. 4,233,106, the disclosure of which is herein incorporated by reference.

In the course of treatment of articles, such as printed circuit boards and the like, it has become commonplace to supply the treatment liquid via orifices in the form of spray heads, nozzles, flood bars and the like, which spray or impinge the treatment liquid upon the articles as they pass the zone of spray emanating from such orifices. In some instances, the printed circuit boards pass in a generally horizontal path of travel, preferably while being in horizontal orientation, and often have the treatment fluid applied from both above and below while the articles are moving along their path of travel.

Especially when the treatment liquid is chemically active, such as an etchant, a stripping solution a developing solution or the like, but also in instances in which it is merely a rinsing liquid, possibly with some minerals therein, it is desirable to prevent the uneven accumulation of liquid on surfaces of articles. Most particularly, for example, when the articles are generally horizontally disposed and oriented, it is undesirable to have puddles of the treatment liquid forming on an upper surface thereof. Even without such puddles, it is desirable that the treatment liquid be substantially evenly disposed along the surfaces of articles being treated, whether from above or below, and whether the articles are horizontally carried, or oriented, or not.

Thus, to facilitate the evenness of application of treatment liquid, and to prevent the aforesaid puddling, it is known in the art to vary the angle of application of treatment liquid from orifices, by pivoting the nozzles, floodbars, spray heads or the like, as articles pass thereby along their path of travel, to provide some variation in the angle of application of treatment liquid, and hence some variation in the angle of impingement of treatment liquid onto surfaces of printed circuit boards, articles or the like. This variation of angular orientation by pivoting or arcuately moving the angle of liquid application tends to reduce opportunity for puddling, tends to apply the liquid more evenly, eliminating dry spots, and tends to chase accumulations of liquid from the articles.

SUMMARY OF THE INVENTION

The present invention is directed toward providing a process and apparatus in which, as articles are delivered along their predetermined path through a zone in which they are being treated by a treatment liquid, they can have the angle of application of the treatment liquid varied, without mechanically re-orienting the nozzles, spray heads, floodbars or the like, but instead, by controlling the sequence of discharge of treatment liquid from orifices that are of different pre-set angular orientations, preferably by appropriate valving of the treatment liquid discharged through the orifices.

Accordingly, it is a primary object of this invention to provide a method and apparatus for treating articles by controlling the delivery of treatment liquid through orifices that are at different angular orientations relative to the path of travel of articles therepast, whereby treatment liquid may impinge upon such articles at different angles of impingement.

It is a further object of this invention to accomplish the above object by providing a plurality of discharge orifices at different angular orientations and sequentially discharging and interrupting the discharge of, treatment fluid, through orifices of different angular orientations relative to the path of travel of articles.

It is another object of this invention to accomplish the above objects such that the discharging and interruption of the discharge of treatment fluid through orifices is at a sufficient frequency and force of application to prevent the formation of puddles of treatment liquid.

It is a further object of this invention to accomplish the above objects in the circumstances in which the articles being treated are generally flat planar members being conveyed along a generally horizontal path while horizontally oriented, and wherein the treatment liquid is chemically active.

It is another object of this invention to accomplish the above objects, by means of alternately opening-up and closing-off the delivery of treatment liquid sequentially from different sets of orifices having different angular orientations, by means of appropriate valving.

Other objects and advantages of the present invention will be readily apparent to those skilled in the art from a reading of the following brief descriptions of the drawing figures, detailed description of the preferred embodiment, and the appended claims.

BRIEF DESCRIPTION OF THE DRAWING FIGURES

DETAILED DESCRIPTION OF THE PREFERRED EMBODIMENT

Figure 1:
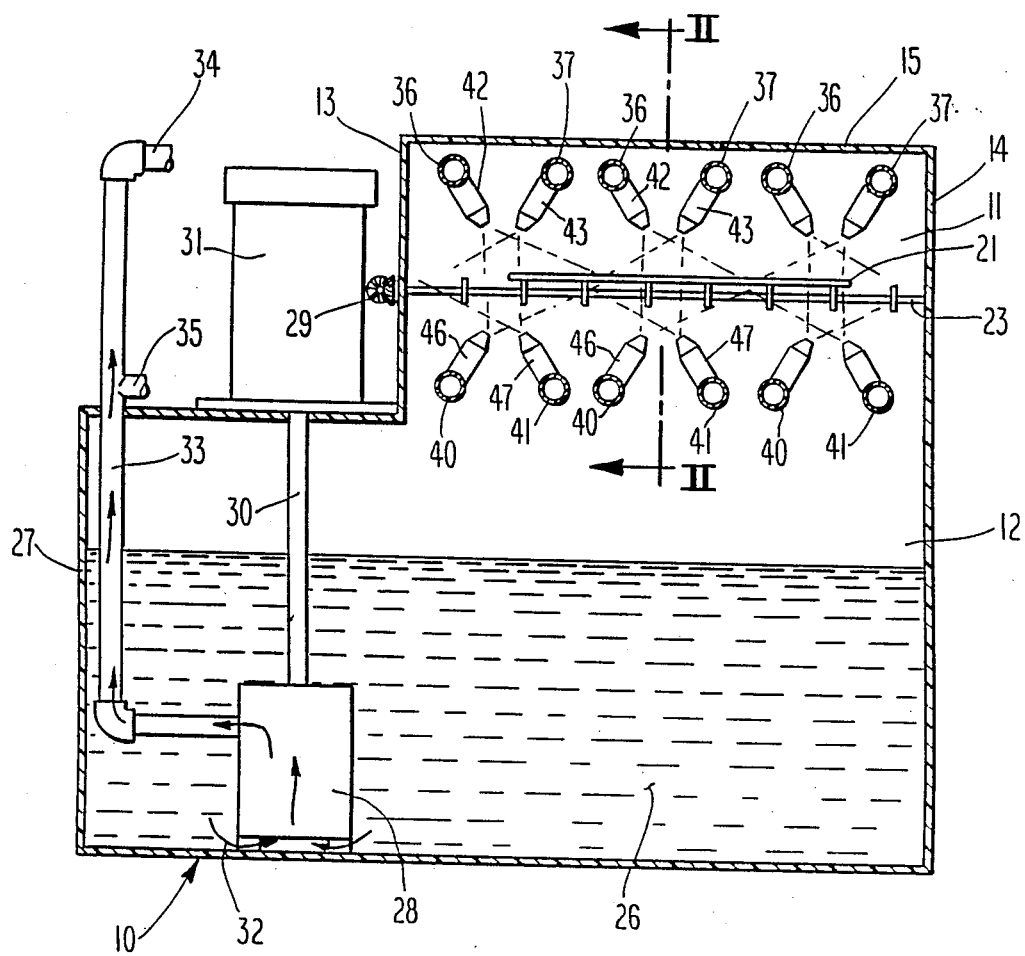
FIG. 1 is a transverse sectional view, partially fragmentally illustrated, through an apparatus for applying treatment liquid in accordance with this invention, as articles to be treated with the treatment liquid travel along a predetermined path into the plane of the paper of the illustration of FIG. 1.

Referring now to the drawings in detail, reference is first made to FIG. 1, wherein there is illustrated a continuous treatment system generally designated by the numeral 10, as including an upper fluid application zone 11, and a lower fluid collection zone 12. Generally, the fluid being applied is a liquid, and preferably an etchant, a stripping solution, or a developing solution. In other instances, the fluid could be a rinsing solution, such as water or the like. Typically, the fluid treatment station will be part of an overall system that may include an inlet unit, an etching unit, a rinsing unit, various other treatment units or stations, drying units, etc. Also, generally, such units or stations may be commonly driven by means of a drive mechanism similar to that set forth in U.S. Pat. No. 4,015,706, the disclosure of which is herein incorporated by reference.

The fluid application zone is provided with sidewalls 13 and 14, a top 15, and left and right ends 16 and 17 having respective inlet and outlet openings 18 and 20. Articles 21 being treated pass from left to right through the apparatus 10, along a generally horizontal path of travel between inlet 18 and exit 20, with the path of travel being defined by drive wheels or disks 22 carried by drive rods 23. The drive rods 23 are driven in a clockwise direction as indicated by the arrow 24 in FIG. 2, such that the printed circuit boards 21 or similarly flat, generally planar horizontally oriented articles pass in the direction of the arrow 25 through the treatment zone 11. The drive rods 23 are driven at their ends, along one side of the conveyor, by appropriate drive gearing 29 similar to that shown in U.S. Pat. No. 4,015,706.

Treatment liquid applied to the articles 21 in the treatment zone 11 can thus pass into the lower end, or sump 12 of the treatment chamber 10 to collect at 26, between sidewalls 14 and 27. Thus, the etchant or other treatment liquid 26 can be recycled for re-use, by being drawn from the sump 12 by mean of a pump 28 driven from a shaft 30, that in turn is driven by a motor 31, to draw treatment liquid thereinto in the direction of the arrows 32, for recirculation up through delivery line 33, to horizontal delivery lines such as 34 and 35.

Figure 3:
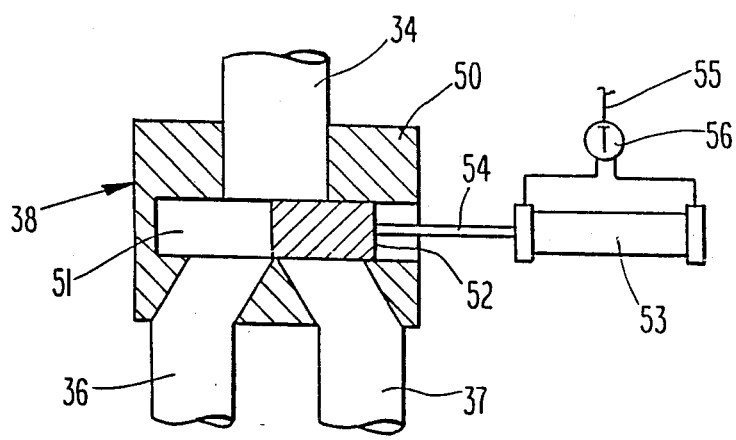
FIG. 3 is an enlarged fragmentary illustration of an appropriate valving apparatus in accordance with this invention.

Each common delivery line 34 will normally supply a plurality of orifice supply lines 36, 37 through an appropriate valve 38, as shown in FIG. 3. Similarly, a common delivery line 35 will supply generally horizontally disposed orifice supply lines 40 and 41, also via a valve similar to that 38.

While, in the illustration of FIG. 1, it will be noted that upper orifice supply lines 36 and 37, and lower orifice supply lines 40, 41 are shown to exist at three spaced apart locations across the path of travel through the treatment zone 11 and extending longitudinally in the direction of travel of a workpiece 21, it will be understood that many such sets of supply lines, with their associated orifices 42, 43 may exist along the path of travel, as are desired. Also, by way of example, it will be noted that in the preferred embodiment illustrated, the nozzles 42 that are connected to supply line 36, are all at the same angular orientation, to provide treatment liquid through an orifice or opening 44, for impingement upon an upper surface of the article 21, as illustrated, at a given angle of application. Alternatively, the various nozzles 44 may be at various angular orientations, as are desired. Similarly, the nozzles 43 will generally all be at the same fixed angular orientation, but, if desired, they may be varied along the length of the conduit 37. In any event, whatever angles are pre-set for the nozzles 42, 43, they will remain fixed, in accordance with the apparatus of this invention. Similarly, the lower nozzles 46, 47 are at different angles of orientation, but fixedly so during application of treatment liquid. In describing the angles of orientation for the nozzles as being fixed, it will be understood that they may be subject to being re-set to other fixed positions, but that, during the course of liquid emanating from the nozzles, for impingement upon surfaces of articles 21 being treated, the nozzles 42, 43, 46, 47, need not be moved, but, by controlling the discharge of fluid from the nozzles, there may be simulated an effect similar to that of oscillating or pivoting the nozzles as fluid emanates therefrom.

Such simulation is done by controlling the discharge of fluid from different sets of nozzle orifices, by alternately opening-up and closing-off the nozzles. This is accomplished by means of the valve 38. Any valving means may be desired, other than that set forth in FIG. 3, and it will therefore be understood that FIG. 3 represents one possible embodiment for a valving arrangement such as will control the delivery of treatment fluid from one set of nozzles or the other, as are desired. The valve 38 includes a housing 50, having a slot 51 therein. The common delivery line 34 is connected to the housing 50, at one end, and orifice supply lines 36 and 37 are connected at the opposite end, such that, in the position shown, with the valve gate 52 blocking the delivery of fluid from common delivery line 34 to orifice supply line 37, such fluid from line 34 can pass only to orifice supply line 36, for emanation through nozzles 42 and discharge from the orifices 44. When it is desired to open the orifice supply line 37 and close that 36, a pneumatic or equivalently operated control such as the cylinder 53 is actuated, such that its plunger 54 pushes the valve gate 52 leftward from the position illustrated therefore in FIG. 3, to close the fluid connection from line 34 to that 36, and open the fluid connection from line 34 to that 37. Thus, the valve gate 52 is operated by the cylinder 53, that, in turn, is driven via a compressed air supply line 55, available in typical manufacturing facilities, through a timer or the like 56, for controlling the timing of the opening and closing of the valve gate 52, in accordance with some pre-set arrangement.

Figure 2:
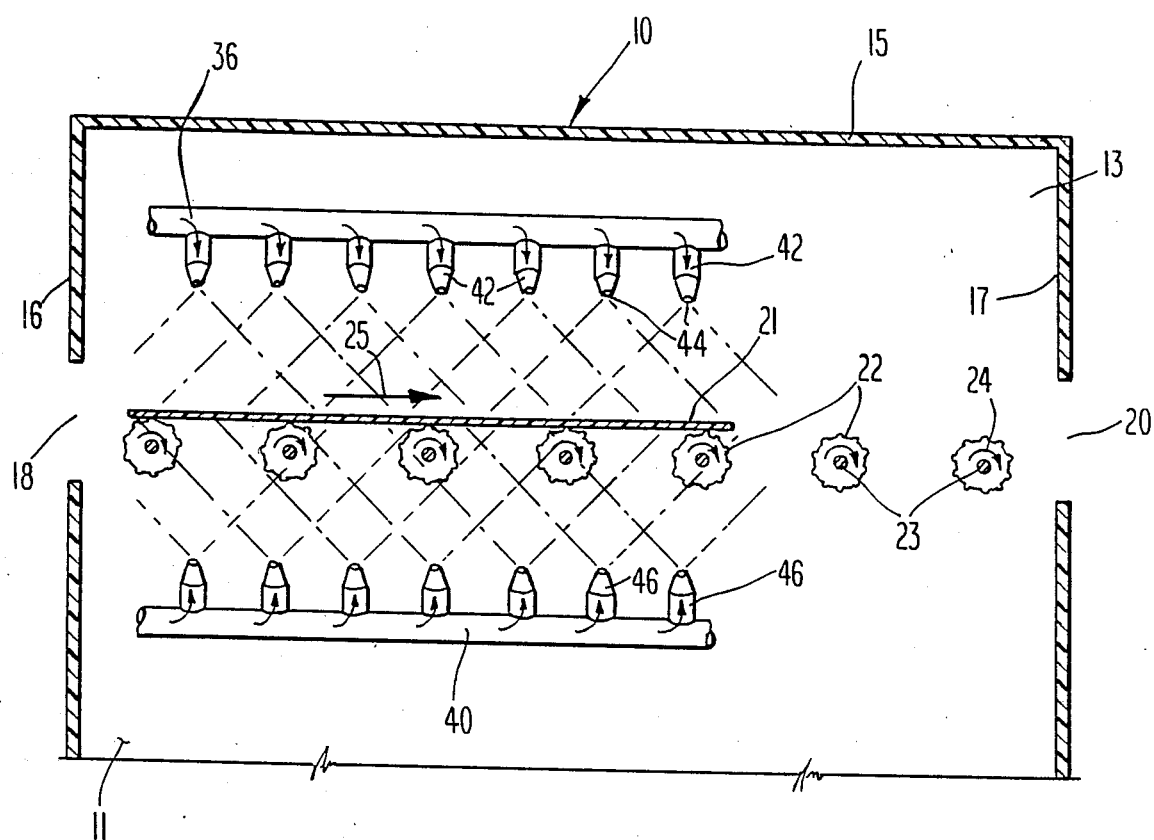
FIG. 2 is an enlarged, fragmentary longitudinal sectional view taken through the apparatus of FIG. 1, generally along the line II—II of FIG. 1.

It will be understood that in the arrangement shown in FIGS. 1 through 3, the valve 38 also alternately provides treatment liquid through nozzles such as those 42 or 43. It will, however, be understood that the common delivery line 34 could supply treatment liquid to larger numbers of orifice supply lines, other than merely the two orifice supply lines 36 and 37, and 42 and 43, and that appropriate valving could be used to open and close different combinations of orifice supply lines, as are desired, in order to obtain any desired pattern of fluid application to articles, simulating the angular pivoting of nozzles and corresponding impingement of liquid onto surfaces of articles 21 being treated, as may be desired.

The cycle time controlled by the timer 56 or other control could be of any desired cycle, such as for the delivery of fluid from line 34 to line 36 for five seconds, then the delivery of fluid from line 34 to line 37 for five seconds. Various other timing sequences may be also be desired. It will also be understood that various other valving arrangements may be substituted for that shown in section in FIG. 3, and that various other controls for such valving arrangements, such as electrical, electronic, solenoid controls, fluid controls or the like may be used in lieu of the pneumatic control illustrated.

As respects delivery of treatment liquid, it will be noted that such may be delivered in accordance with U.S. Pat. No. 4,650,542, the complete disclosure of which is herein incorporated by reference.

What is claimed is:

1. A process for chemically treating articles in a chamber with a liquid treatment fluid, wherein the fluid is applied to articles being treated along a path of travel for the articles, the process including the steps of:

(a) providing a substantially closed chamber for treating articles therein;

(b) delivering articles along a path of travel through the chamber;

(c) applying a liquid treatment fluid to articles being delivered along their path of travel through the chamber by:

(i) providing a plurality of discharge orifices for treatment fluid at at least some different angular orientations relative to the path of travel of articles, and (ii) sequentially discharging and interrupting the discharge of, treatment fluid, through orifices of different angular orientations relative to the path of travel of articles, whereby treatment fluid, in an interrupted manner, impinges on articles at different angles of impingement.

2. The process of claim 1, wherein the articles being treated are generally flat planar members, wherein the treatment fluid is chemically active, and wherein the articles are being conveyed along a generally horizontal path while in a generally horizontal orientation.

3. The process of claim 2, wherein the sequence of sequentially discharging and interrupting the discharge of, treatment fluid through orifices, is at a sufficient frequency and the flow of treatment fluid through orifices is sufficiently forceful, to prevent the formation of puddles of treatment fluid on the substantially flat, substantially horizontal upper surfaces of articles.

4. The process of claim 1, wherein the discharge orifices are provided in two different angular orientations, and wherein the sequential discharging and interrupting step is accomplished by alternately opening-up and closing-off the discharge of treatment fluid from orifices at the two different angles of orientation.

5. The process of claim 4, wherein treatment fluid is provided to the orifices from a common delivery line, which is connected to two orifice supply lines through a valve, and wherein the alternate opening-up and closing-off step comprises actuating the valve to supply treatment fluid from the common delivery line to first one, then the other of the orifice supply lines.

6. The process of claim 2, wherein the chamber is provided with inlet and outlet openings and wherein the articles are delivered along their path of travel between the inlet and outlet openings.

7. The process of claim 2, wherein the treatment fluid is applied to articles from both above and below as they move along their generally horizontal path of travel.

8. The process of claim 2, wherein the discharge orifices are provided in two different angular orientations, and wherein the sequential discharging and interrupting step is accomplished by alternately opening-up and closing-off the discharge of treatment fluid from orifices at the two different angles of orientation.

9. The process of claim 8, wherein treatment fluid is provided to the orifices from a common delivery line, which is connected to two orifice supply lines through a valve, and wherein the alternate opening-up and closing-off step comprises actuating the valve to supply treatment fluid from the common delivery line to first one, then the other of the orifice supply lines.

10. The process of claim 1, wherein the articles being treated are generally flat planar members, wherein the treatment fluid is chemically active, and wherein the articles are being conveyed along a generally horizontal path while in a generally horizontal orientation, wherein the sequence of sequentially discharging and interrupting the discharge of, treatment fluid through orifices, is at a sufficient frequency and the flow of treatment fluid through orifices is sufficiently forceful, to prevent the formation of puddles of treatment fluid on the substantially flat, substantially horizontal upper surfaces of articles, wherein the discharge orifices are provided in two different angular orientations, and wherein the sequential discharging and interrupting step is accomplished by alternately opening-up and closing-off the discharge of treatment fluid from orifices at the two different angles of orientation, wherein treatment fluid is provided to the orifices from a common delivery line, which is connected to two orifice supply lines through a valve, and wherein the alternate opening-up and closing-off step comprises actuating the valve to supply treatment fluid from the common delivery line to first one, then the other of the orifice supply lines, wherein the chamber is provided with inlet and outlet openings and wherein the articles are delivered along their path of travel between the inlet and outlet openings, and wherein the treatment fluid is applied to articles from both above and below as they move along their generally horizontal path of travel.

11. Apparatus for chemically treating articles in a chamber with a liquid treatment fluid, wherein the fluid is applied to articles being treated along a path of travel for the articles, the apparatus including:

(a) means providing a substantially closed chamber for treating articles therein;

(b) means for delivering articles along a path of travel through the chamber;

(c) means for applying a liquid treatment fluid to articles being delivered along their path of travel through the chamber, including (i) means providing a plurality of discharge orifices for treatment fluid at at least some different angular orientations relative to the path of travel of articles, and (ii) means for sequentially discharging and interrupting the discharge of, treatment fluid, through orifices of different angular orientations relative to the path of travel of articles, whereby treatment fluid, in an interrupted manner, impinges on articles at different angles of impingement.

12. The apparatus of claim 11, wherein the articles to be treated are generally flat planar members wherein the treatment fluid to be applied is chemically active, and wherein the means for delivering the articles includes means for arranging the articles along a generally horizontal path while in a generally horizontal orientation.

13. The apparatus of claim 12, wherein the means for sequentially discharging and interrupting the discharge of, treatment fluid through orifices, includes means for doing so at a sufficient frequency and the means for providing treatment fluid through orifices is sufficiently forceful, to together, provide means for preventing the formation of puddles of treatment fluid on the substantially flat, substantially horizontal upper surfaces of articles.

14. The apparatus of claim 11, wherein the discharge orifices have two different angular orientations, and wherein the means for sequentially discharging and interrupting includes means for alternately opening-up and closing-off the discharge of treatment fluid from orifices at the two different angles of orientation.

15. The apparatus of claim 14, including a common delivery line, a valve, and two orifice supply lines, including means providing treatment fluid to the orifices from the common delivery line, which is connected to the two orifice supply lines through the valve, and wherein the means for alternately opening-up and closing-off the discharge of fluid comprises means actuating the valve to supply treatment fluid from the common delivery line to first one, then the other of the orifice supply lines.

16. The apparatus of claim 12, wherein the chamber is provided with inlet and outlet openings and including means for delivering the articles along their path of travel between the inlet and outlet openings 17. The apparatus of claim 12, including means for applying treatment fluid to articles from both above and below as they move along their generally horizontal path of travel.

18. The apparatus of claim 12, wherein the discharge orifices have two different angular orientations, and wherein the means for sequentially discharging and interrupting includes means for alternately opening-up and closing-off the discharge of treatment fluid from orifices at the two different angles of orientation.

19. The apparatus of claim 14, including a common delivery line, a valve, and two orifice supply lines, including means providing treatment fluid to the orifices from the common delivery line, which is connected to the two orifice supply lines through the valve, and wherein the means for alternately opening-up and closing-off the discharge of fluid comprises means actuating the valve to supply treatment fluid from the common delivery line to first one, then the other of the orifice supply lines.

20. The apparatus of claim 11, wherein the articles to be treated are generally flat planar members, wherein the treatment fluid to be applied is chemically active, and wherein the means for delivering the articles includes means for arranging the articles along a generally horizontal path while in a generally horizontal orientation, wherein the means for sequentially discharging and interrupting the discharge of, treatment fluid through orifices, includes means for doing so at a sufficient frequency and the means for providing treatment fluid through orifices is sufficiently forceful, to together, provide means for preventing the formation of puddles of treatment fluid on the substantially flat, substantially horizontal upper surfaces of articles, wherein the discharge orifices have two different angular orientations, and wherein the means for sequentially discharging and interrupting includes means for alternately opening-up and closing-off the discharge of treatment fluid from orifices at the two different angles of orientation, including a common delivery line, a valve, and two orifice supply lines, including means providing treatment fluid to the orifices from the common delivery line, which is connected to the two orifice supply lines through the valve, and wherein the means for alternately opening-up and closing-off the discharge of fluid comprises means actuating the valve to supply treatment fluid from the common delivery line to first one, then the other of the orifice supply lines, wherein the chamber is provided with inlet and outlet openings and including means for delivering the articles along their path of travel between the inlet and outlet openings, and including means for applying treatment fluid to articles from both above and below as they move along their generally horizontal path of travel.

* * * * *